United States Patent [19]

Anhalt et al.

[11] 3,902,777

[45] Sept. 2, 1975

[54] ELECTRICAL CONNECTOR ASSEMBLY

[75] Inventors: John W. Anhalt; David S. Goodman, both of Orange; John R. Moore, Santa Ana, all of Calif.

[73] Assignee: International Telephone and Telegraph Corporation, New York, N.Y.

[22] Filed: May 16, 1974

[21] Appl. No.: 470,630

[52] U.S. Cl........ 339/17 C; 339/17 CF; 339/75 MP; 339/176 MP

[51] Int. Cl.$^2$............................................ H05K 1/12

[58] Field of Search......... 339/17 C, 17 CF, 75 MP, 339/176 MP

[56] References Cited

UNITED STATES PATENTS 3,335,327 8/1967 Damon et al. .............. 339/17 CF X

*Primary Examiner*—Roy Lake
*Assistant Examiner*—E. F. Desmond
*Attorney, Agent, or Firm*—Thomas L. Peterson

[57] ABSTRACT

A device for retaining a solderless electronic component, such as a integrated circuit socket, on a printed circuit board. The device comprises a metal plate which includes a central section and a pair of downwardly extending legs. The central section overlies a portion of the electronic component while the legs extend below the lower surface of the component and are press-fit into aligned holes in the printed circuit board. The metal retaining member also serves as a heat sink for the electronic component.

13 Claims, 9 Drawing Figures

ELECTRICAL CONNECTOR ASSEMBLY

The present invention relates generally to an electrical connector assembly and, more particularly, to means for retaining a solderless electronic component on a mounting member, such as a printed circuit board.

The present invention is concerned with those types of electronic components which are mounted on mounting boards without solder connections. These components will be referred to hereinafter as being "solderless" electronic components. The component may be, for example, a printed circuit board connector or an integrated circuit socket for a dual-in-line plug (DIP). Each of these components includes an insulator housing. It is conventional practice to secure the housing on the mounting board by means of bolts or integral hubs which are press-fit into holes in the board. U.S. Pat. No. 3,475,657 to Knowles discloses a printed circuit board connector having contacts therein which make a wiping engagement with traces on the board on which it is mounted. The connector is secured to the board by means of bolts. Pat. pat. No. 3,311,790 to Vizzier et al. discloses an integrated circuit socket which is secured to a mounting board by means of bolts or clamps. Such securing means is relatively expensive and is time consuming to assemble. Copending application of Anhalt et al, entitled, "Electrical Connector Assembly", Ser. No. 336,606, filed Feb. 28, 1973, assigned to the assignee of this application, now U.S. Pat. No. 3,815,077 discloses an integrated circuit socket for a dual-in-line plug in which the socket housing is secured to the mounting board by the press fit of integral hubs on the housing with holes in the board. This plastic retention arrangement may sometimes be unreliable due to fracturing of the hubs. Also, manufacturing of the hubs and holes in the mounting board is difficult due to close dimensional requirements for the press-fit retention system.

It is the object of the present invention to overcome the attendant disadvantages of the presently used retention methods for electronic components by eliminating the plastic retention hubs on the component housing and employing a metal retaining member which does not require a threaded engagement as does a bolt. The retaining member of the present invention should not be confused with a metal bus bar frequently utilized in electrical connectors, such as disclosed in U.S. Pat. No. 3,634,814 to Inacker, wherein the bus bar is connected to or integral with selected contacts in the connector and are press fit into the housing rather than directly into the mounting board. The retention member of the present invention is relatively simple in configuration, may be inexpensively produced by mass production techniques, and may be assembled without the use of special tools or soldering. The retaining member also permits the electronic component to be readily removed for replacement without unsoldering or severing any connections, or using any special tools.

SUMMARY OF THE INVENTION

According to a principal aspect of the present invention, there is provided an electrical connector assembly comprising an insulative mounting member which has at least two holes therein. A solderless electronic component is mounted on the mounting member adjacent to the holes. The novel retaining member of the invention is formed of metal and includes a central section and a pair of downwardly extending legs. The central section overlies a portion of the electronic component and the legs extend below the lower surface of the component into the holes. The legs have an interference fit with the holes for tightly retaining the electronic component on the mounting member. The retaining member may be secured into the holes in the mounting member by simply applying a downward force thereon, thus not requiring the use of any tools to complete the assembly. The metal retaining member is lower in cost than the plastic retention system of the type disclosed in the aforementioned Anhalt et al application and does not fracture as do plastic hubs. Moreover, the metal retaining member functions as a heat sink for the electronic component.

Other aspects and advantages of the invention will become more apparent from the following description taken in connection with the accompanying drawings.

DESCRIPTION OF THE PREFERRED EMBODIMENTS

Figures 1, 2, 3:
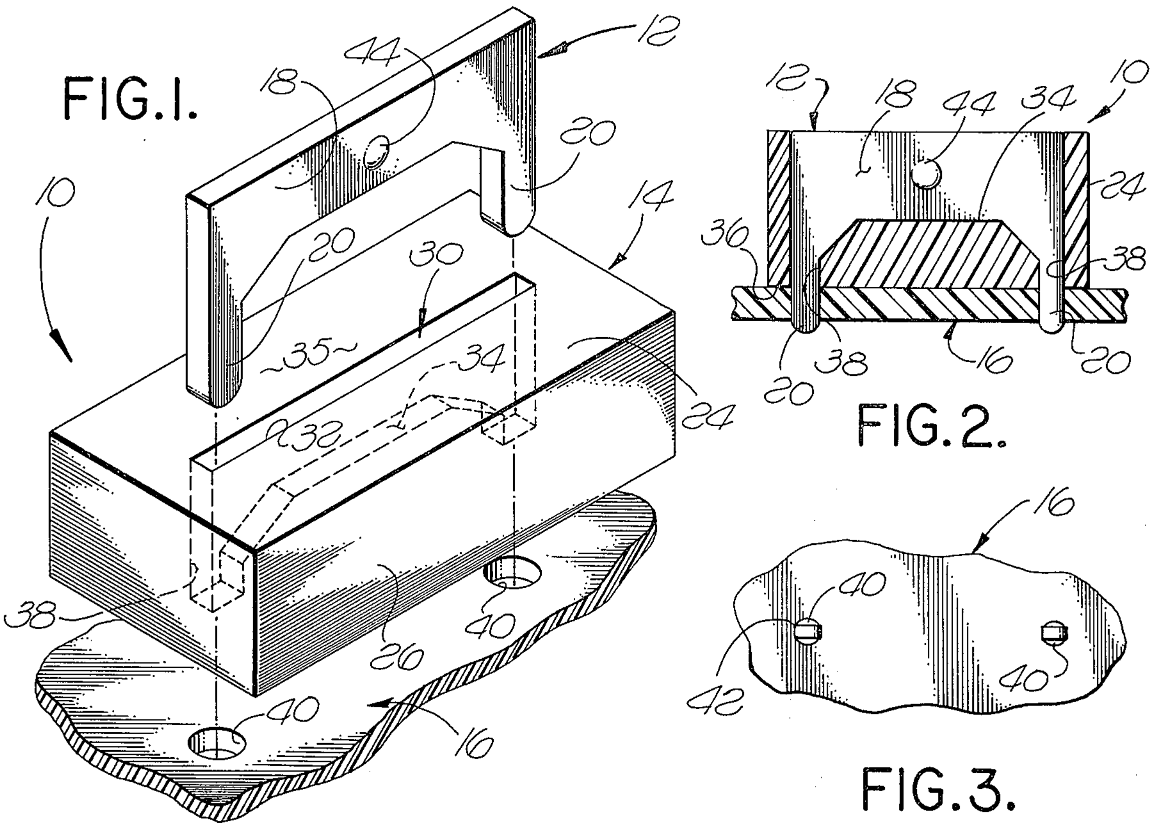
FIG. 1 is an exploded perspective view of the connector assembly of the present invention including a retaining member, an electronic component and a mounting board.
FIG. 2 is a partial longitudinal sectional view through the assembly illustrated in FIG. 1, with the various parts fully interconnected.
FIG. 3 is a bottom plan view of the assembly illustrated in FIG. 2 showing the connection between the retaining member and the holes in the mounting member.

Referring now to FIGS. 1–3 in detail, there is illustrated one embodiment of the connector assembly of the present invention, generally designated 10. The assembly includes a retaining member 12, a solderless electronic component 14 and a mounting member 16. The mounting member is an insulative planar board, such as a printed circuit board. The electronic component 14 may be an integrated circuit socket for a DIP, a printed circuit board connector, or any other electronic component of the solderless variety, for example, a leadless IC package or relay.

The retaining member 12 is a one-piece unitary plate of self-supporting, relatively rigid metal. The member may be stamped from a sheet of metal of suitable thickness. The member is flat, and in use, is disposed vertically with respect to the board 16. The retaining member includes a central section 18 and a pair of legs 20 which are integral with the central section and extend downwardly from the opposite ends thereof.

The electronic component 14 includes an insulator housing 24 having a pair of sidewalls 26 and end walls 28. A recess, generally designated 30, is provided in the housing for receiving the retaining member 12. In this embodiment of the invention, the recess includes a vertically extending slot 32 which opens at the upper surface 35 of the housing. Preferably the slot is positioned midway between the sidewalls 26 and parallel thereto. The ends of the slot are spaced from the end walls 28. The slot is slightly longer than the retaining member 12, and the width of the slot is slightly greater than the width of the retaining member so that the member may be slidably inserted into the slot. As best in FIG. 2, the bottom 34 of the slot 32 is above the lower surface 36 of the housing 24 and is spaced from the upper surface 35 a distance corresponding to the height of the central section 18 of the retaining member. Vertical passages 38 extend downwardly from opposite ends of the slot to the lower surface 36 of the housing. The passages are spaced apart a distance corresponding to that of the legs 20.

It is noted that the legs 20 on the retaining member have a rectangular cross section. The vertical passages 38 have a configuration complementary to that of the legs 20 for slidably receiving the legs. The legs are sufficiently long so that they will extend well below the lower surface 36 of the housing.

The mounting member 16 is formed with a pair of circular holes 40 which are spaced apart a distance corresponding to the distance between the legs 20 on the retaining member. To assemble the electronic component onto the mounting board 16, the retaining member is inserted into the recess 30. Then the component is positioned over the board 16 with the legs 20 of the retaining member aligned with the holes 40. Pressure is then applied to the upper edge of the retaining member forcing the legs 20 downwardly into the holes 40. The legs are dimensioned so as to have interference fit with the walls of the holes. Such a connection is sometimes referred to in the art as being a press-fit connection. The connection requires that each leg 20 have an angular edge, as indicated by reference numeral 42, which deforms the wall of the hole 40. It will be appreciated that the legs 20 could have a square cross section rather than rectangular cross section as shown. Hence, by this press-fit connection, the retaining member 12 and component 14 are firmly attached to the mounting board.

A dimple 44 is preferably provided on the side of the central section 18 of the retaining member which cooperates with the side of the slot 32 to firmly hold the housing 24 of the electronic component 14 relative to the retaining member. Hence, the housing will not be allowed to shift relative to the retaining member or the mounting board.

Thus, it will be appreciated that by the present invention an electronic component may be rapidly and easily assembled to a mounting board by the retaining member 12. No special tools are required to secure the component to the board. In addition, each component can be disassembled from the board by applying sufficient upward force to the bottom of the legs 20 forcing them upwardly out of the holes 40. Thus, no unsoldering or severing of any connections is required to remove the component from the board. It will further be appreciated that the retaining member may be easily and inexpensively manufactured by mass production techniques, by simply stamping the retaining member from sheet metal stock.

Figure 4:
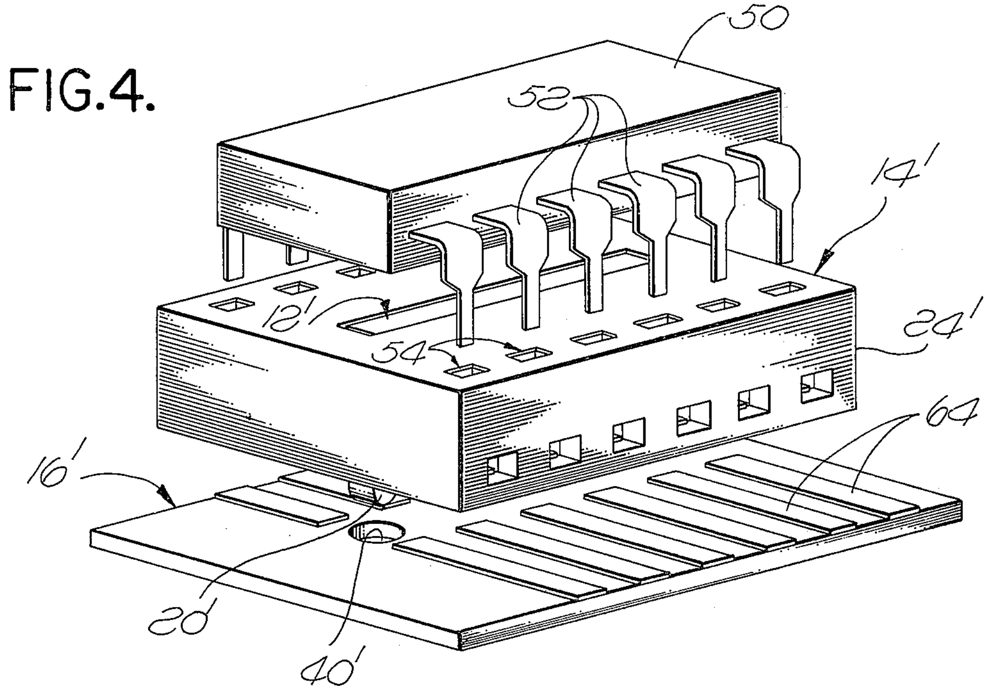
FIG. 4 is an exploded perspective view illustrating another assembly in accordance with the present invention employing an integrated circuit socket as the electronic component, with a dual-in-line plug shown in position to be inserted into the socket.
Figure 5:
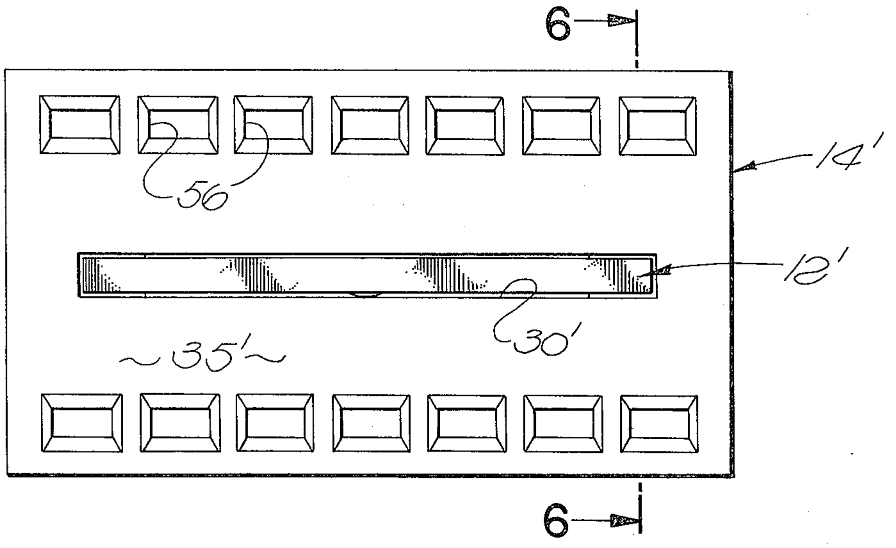
FIG. 5 is a top plan view of the socket illustrated in FIG. 4, with the retaining member mounted therein.
Figure 6:
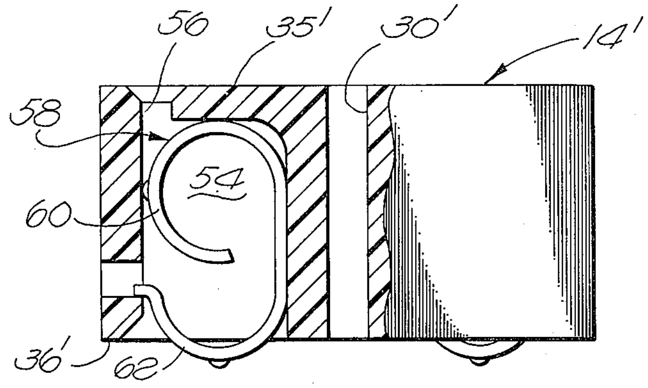
FIG. 6 is a partial vertical sectional view taken along line 6—6 of FIG. 5, showing one of the contacts employed in the socket.
Figure 7:
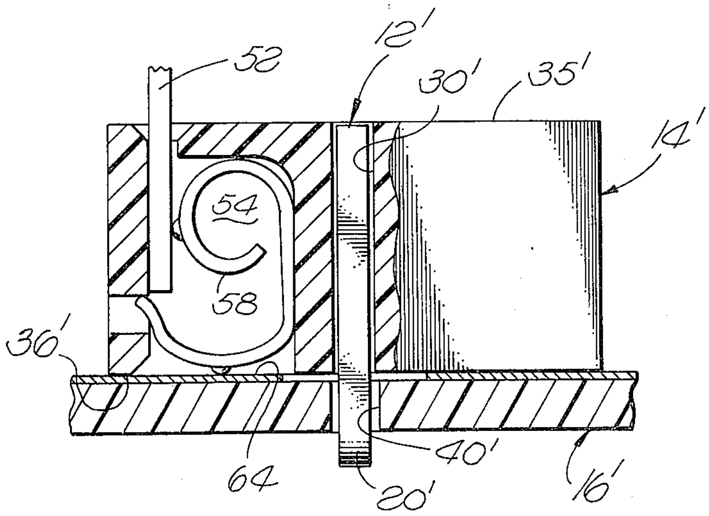
FIG. 7 is a vertical sectional view similar to FIG. 6 showing the socket mounted on a mounting board by the retaining member of the present invention, and with a lead of the DIP inserted in a contact compartment.

FIGS. 4–7 illustrate the novel features of the present invention as applied to an integrated circuit socket for a dual-in-line plug. In this embodiment, the basic structure is as previously described and like numbers primed are used to indicate like or corresponding parts. FIG. 4 illustrates a dual-in-line plug (DIP) 50 having a plurality of downwardly extending electrical leads 52 along the sides thereof. The housing 24′ of the socket 14′ is formed with two rows of contact compartments 54 which are disposed in a pattern corresponding to the pattern of the leads 52 of the DIP. Openings 56 extend upwardly from each compartment 54 to the upper surface 35′ of the housing. The compartments 50 open at the bottom surface 36′ of the housing. Each compartment contains a spring contact member 58 which has a first curved section 60 disposed under the opening 36 and a second convexly curved lower portion 62 which extends below the lower surface 36′ of the housing. A recess 30′ is disposed between the two rows of contact compartments 54. The mounting member 16′ has a plurality of conductive strips or traces 64 on its upper surface which lie below the contact compartments 54 when the socket 14′ is mounted thereon by means of the retaining member 12′ of the present invention. When the socket 14′ is mounted on the mounting member 16′, the lower portion 62 of each contact has a wiping engagement with its respective trace 64, as best seen in FIG. 7. FIG. 7 also illustrates one of the DIP leads 52 inserted through an opening 56 of the socket 14′ for electrical engagement by the contact 58. The retaining member 12′ and the recess 30′ in the socket 14′ may be constructed exactly as shown in FIGS. 1–3. The legs 20′ are press fit into aligned holes 40′ in the member 16′. For further details regarding the structure of the socket 14′, reference may be had to the aforementioned Anhalt et al application, except that the plastic hubs of the Anhalt socket assembly are eliminated by the present invention.

Figure 8:
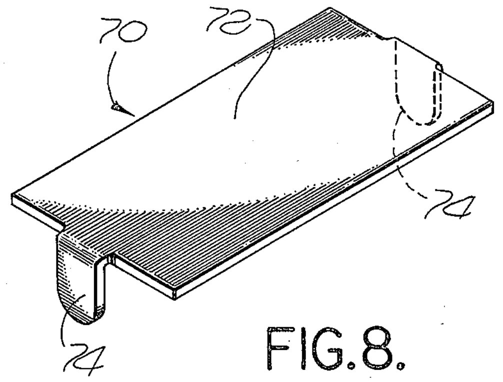
FIG. 8 is a perspective view of a modified form of the retaining member of the present invention.
Figure 9:
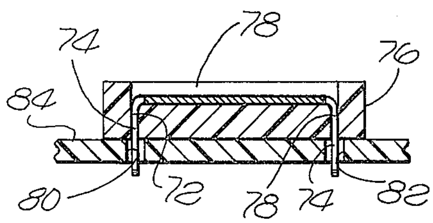
FIG. 9 is a partial vertical sectional view through a connector assembly in accordance with the present invention employing the retaining member illustrated in FIG. 8.

Referring now to FIGS. 8 and 9, there is shown a further form of the assembly of the present invention. In FIG. 8, there is illustrated a metal retaining member 70 having a flat horizontally disposed rectangular central section 72 and a pair of integral downwardly extending legs 74 at the opposite ends thereof, which may be identical to the legs in FIGS. 1–3. The electronic component 76 in FIG. 9 is formed with a rectangular recess 78 in its upper surface which is complementary to the rectangular central section 72 of the retaining member 70. A pair of vertical passages 78 extend downwardly from opposite ends of the recess 70 to the lower surface 80 of the member 76. The legs 74 extend downwardly through these passages 78 and have an interference fit with aligned holes 82 in a mounting board 84 as in the manner previously described. The edges of the central rectangular section 72 of the retaining member 70 cooperate with the sides of the recess 78 to snugly retain the component 76 with respect to the retaining member and hence to the board 84. Other modifications and variations within the scope of the invention will be apparent to those skilled in the art.

What is claimed is:

1. An electrical connector assembly comprising:
an insulative mounting member having at least two holes therein;
a solderless electronic component mounted on said mounting member adjacent to said holes;
a recess in said component opening at the upper surface thereof;
a vertical passage extending downwardly from each end of said recess to the lower surface of said component;
a conductive retaining member including a central section and a pair of downwardly extending legs;
said central section lying in said recess; and
said legs extending downwardly through said passages below the lower surface of said component into said holes and having an interference fit with said holes for retaining said component on said mounting member.

2. An electrical connector assembly as set forth in claim 1 wherein:
said retaining member comprises a flat vertically extending metal sheet; and
said recess is a vertically extending slot having a width slightly greater than the width of said retaining member, said slot slidably receiving said central section of said retaining member.

3. An electrical connector assembly as set forth in claim 1 wherein:
said central section of said retaining member comprises a horizontally disposed flat metal sheet;
said legs are integrally joined to opposite ends of said central section; and
said recess has a configuration complementary to that of said central section, said central section being snugly fitted in said recess.

4. An electrical connector assembly as set forth in claim 1 wherein:
said retaining member is a one-piece unitary metal sheet.

5. An electrical connector assembly as set forth in claim 1 wherein:
said holes are circular; and
each said leg has an angular edge deforming the wall of the hole in which it is mounted.

6. An electrical connector assembly as set forth in claim 1 wherein:
said retaining member is the sole means for securing said component to said mounting member.

7. An electrical connector assembly as set forth in claim 1 wherein:
said mounting member has a plurality of conductive traces on the upper surface thereof; and
said component contains a plurality of electrical contacts each having a wiping engagement with a respective one of said traces.

8. An electrical connector adapted to be secured to a mounting member having at least two holes therein comprising:
a solderless electronic component having a recess opening at the upper surface thereof;
a vertical passage extending downwardly from each end of said recess to the lower surface of said component;
a conductive retaining member including a central section lying in said recess and a pair of downwardly extending legs positioned in said passages; and
said legs extending below the lower surface of said component and dimensioned to have an interference fit with the holes in said mounting member.

9. An electrical connector as set forth in claim 8 wherein:
said retaining member comprises a flat vertically extending metal sheet; and
said recess is a vertically extending slot having a width slightly greater than the width of said retaining member, said slot slidably receiving said central section of said retaining member.

10. An electrical connector as set forth in claim 9 including:
a dimple on the side of said central section frictionally engaging the side of said slot.

11. An electrical connector as set forth in claim 8 wherein:
said central section of said retaining member comprises a horizontally disposed flat metal sheet;
said legs are integrally joined to opposite ends of said central section; and
said recess has a configuration complementary to that of said central section, said central section being snugly fitted in said recess.

12. An electrical connector as set forth in claim 8 wherein:
said component contains a plurality of electrical contacts unconnected to said retaining member.

13. An electrical connector as set forth in claim 12 wherein:
each said contact has a convexly curved lower portion extending slightly below the lower surface of said component for making wiping contact with a trace on the upper surface of said mounting member.

* * * * *